(12) United States Patent
Wang

(10) Patent No.: US 6,989,594 B2
(45) Date of Patent: Jan. 24, 2006

(54) DEVICE FOR COOLING HOT SPOT IN MICRO SYSTEM

(75) Inventor: Ming-Wen Wang, Tucheng (TW)

(73) Assignee: Oriental Institute of Technology, Taipei (TW)

( * ) Notice: Subject to any disclaimer, the term of this patent is extended or adjusted under 35 U.S.C. 154(b) by 0 days.

(21) Appl. No.: 11/130,571

(22) Filed: May 16, 2005

(65) Prior Publication Data

US 2005/0212124 A1    Sep. 29, 2005

Related U.S. Application Data

(62) Division of application No. 10/866,161, filed on Jun. 10, 2004.

(30) Foreign Application Priority Data

Jan. 30, 2004    (TW) .............................. 93102241 A

(51) Int. Cl.
  *H01L 23/34* (2006.01)
  *H01L 21/48* (2006.01)
  *H01L 7/20* (2006.01)

(52) U.S. Cl. ................. 257/714; 257/715; 257/784; 438/122; 361/689; 361/699

(58) Field of Classification Search ............... None
See application file for complete search history.

(56) References Cited

U.S. PATENT DOCUMENTS

| 2004/0104022 A1* | 6/2004 | Kenny et al. ............... 165/299 |
| 2005/0046017 A1* | 3/2005 | Dangelo ..................... 257/720 |
| 2005/0139996 A1* | 6/2005 | Myers et al. ............... 257/712 |

FOREIGN PATENT DOCUMENTS

TW    469613 A  *  1/2001

* cited by examiner

*Primary Examiner*—Hoai Pham

(57) ABSTRACT

A device and method for cooling a hot spot are provided. The cooling device for cooling a micro hot spot includes a first substrate, a first channel formed on the first substrate and having two narrowed ends, a second channel formed on the first substrate and connected to the first channel, a cooling fluid injected into the first channel and the second channel, a second substrate connected to the first substrate and having the micro hot spot disposed thereon, two of wires disposed at the narrowed ends of the first channel, and a power supply for providing a pulse current to the wires, thereby micro bubbles being produced around the wires.

8 Claims, 8 Drawing Sheets

DEVICE FOR COOLING HOT SPOT IN MICRO SYSTEM

CROSS REFERENCE TO PRIOR APPLICATIONS

This application is a divisional of U.S. Ser. No. 10/866,161, filed Jun. 10, 2004, entitled "Device and Method for Cooling Hot Spot in Micro System", which claims priority to Taiwan application number 093102241, filed on Jan. 30, 2004.

FIELD OF THE INVENTION

This invention relates to a device and a method for cooling hot spots in a micro system, and more particularly to a device and a method for providing a reciprocating fluid flow to cool hot spots in a micro system.

BACKGROUND OF THE INVENTION

The size of a micro optoelectonic component is getting smaller and smaller due to the progressed manufacturing technologies. However, when a micro electronic component is actuated, the temperature of the micro electronic component always rapidly rises owing to the slight increase of the driving current. For example, for the GaAs semiconductor laser and the AlGaAs semiconductor quantum well laser, the electroluminescence results in the rapidly risen temperature of the semiconductor components, so that the micro hot spots are formed. The overheated micro hot spots generally cause the electronic component to be destroyed. Therefore, it is a very important issue for achieving the efficient heat dissipation of micro hot spots when the micro electronic component is actuated.

Since the average size of a micro hot spot is about 50×50 $\mu m^2$, the sizes of cooling devices made by the traditional electromechanical technologies are too large to be used for dissipating the heat of a micro hot spot. For example, since the size of the traditional thermalelectric cooling devices is about 2×2 $mm^2$ and it is very difficult for the thermalelectric devices to be microfabricated, the traditional thermalelectric cooling devices cannot be used for cooling micro hot spots. Similarly, the traditional cooling module formed by micro heat pipes (about 35 mm diameter) is hardly microfabricated.

The traditional cooling devices having micro channels and hot wells can be designed for cooling micro hot spots; however, the cooling device has to be additionally assembled with a pump having a larger size. It is complicated to assemble the cooling device and the pump owing to the limitation of the materials thereof, and furthermore the cooling fluid flow therein is restricted by the drag force.

C. J. Kim discloses a micro pump formed by the continuous electronic wetting and LIGA (lithography, gavanoformung, and abformung), wherein electrodes with alternate magnetic fields are provided for driving mercury drops to oscillate, so that valves at the openings of the channels are indirectly controlled and the oscillatory fluid flow is formed. (C. J. Kim et al 2001, A micropump driven by continuous electrowetting actuation for low voltage and low power operations.) Although the components provided by C. J. Kim are approximately integrated, the size of the whole device is about 15 mm. Apparently, the device provided by C. J. Kim cannot be used for cooling micro hot spots.

In order to overcome the disadvantages of the prior art described above, the present invention provides a device and a method for generating reciprocating fluid flow to efficiently cool micro hot spots in a micro system.

SUMMARY OF THE INVENTION

It is an aspect of the present invention to provide a cooling device for cooling a micro hot spot in a micro system. In accordance with the aspect of the present invention, the cooling device includes a first substrate, a first channel formed on the first substrate and having two narrowed ends, a second channel formed on the first substrate and connected to the first channel, a cooling fluid injected into the first channel and the second channel, a second substrate connected to the first substrate and having the micro hot spot disposed thereon, two of wires disposed at the narrowed ends of the first channel, and a power supply for providing a pulse current to the wires, thereby micro bubbles being produced around the wires. The wires are disposed at the narrowed end in the first channel and connected to a multiplex pulse power supply, so that the pulse currents are alternately provided to the wires and the temperature of the wires can reach the nucleation temperature in a very short time, thereby micro bubbles are producing around the wires. The expansion and contraction of the micro bubbles cause the cooling fluid to form the reciprocating flow for passing by the micro hot pot, and therefore the heat of the micro hot spot is dissipated and the temperature of the micro hot spot is lowered.

It is another aspect of the present invention to provide a cooling device in a micro system for generating a reciprocating flow to cool a micro hot spot in order to prevent the electronic component from being destroyed by the overheated spot. It is achieved by the present invention that the heat of the micro hot spot can be completely dissipated if the temperature of the micro hot spot is lower, and the heat of the micro hot spot can be evenly diffused if the micro hot spot is overheated.

It is another aspect of the present invention to provide a cooling device, which can be easily microfabricated and integrated into an electronic component.

In accordance with the present invention, the micro hot spot is preferably a micro-hot-spot chip.

Preferably, the first substrate is a glass substrate having a metal film with a high impedance coated thereon.

Preferably, the second substrate is one of a high molecular metal substrate and a metal substrate with a high impedance.

Preferably, the second substrate is connected to the first substrate by means of a plasma activation.

Preferably, the wires are disposed at the narrowed ends of the first channel by an ultrasonic micro pressing device.

Preferably, the power supply is a multiplex pulse power supply system.

In accordance with the present invention, a method for providing a reciprocating flow to cool a micro hot spot is provided. The method includes steps of (a) providing a first substrate, (b) forming a first channel disposed on the first substrate and having two narrowed ends, (c) forming a second channel disposed on the first substrate and connected to the first channel, (d) providing two wires at the narrowed ends of the first channel, wherein the wires extend out of the ends of the first channel, (e) providing a second substrate having the micro hot spot thereon and connected to the first substrate, (f) injecting a cooling fluid into the first channel and the second channel, (g) providing a pulse current alternately to the wires for producing micro bubbles around the wires, wherein expansion and contraction of the micro bubbles cause the cooling fluid to form the reciprocating flow for passing by the micro hot spot.

Preferably, the first substrate is a glass substrate having a metal film with a high impedance coated thereon.

Preferably, the first channel is formed through an isotropical etching by a low concentration of hydrofluoric acid.

Preferably, the wires are fine platinum wires.

Preferably, the wires are disposed at the narrowed ends of the first channel by an ultrasonic micro pressing device, and the wires are pulled to expand out of the ends.

Preferably, the second substrate is one of a high molecular metal substrate and a metal substrate with a high impedance.

Preferably, the second substrate is connected to the first substrate by means of a plasma activation.

Preferably, the step (e) further includes forming a first hole and a second hole by means of a laser after a package of the first channel is completed, and the first hole is bigger than the second hole.

Preferably, the cooling fluid is injected into the first channel via the second hole on the second substrate, and the second hole is filled with a photopolymerizable resin after the injecting is completed.

Preferably, the cooling fluid is one of a deionized water and a refrigerant.

Preferably, the micro hot spot is a micro-hot-spot chip.

Preferably, the micro-hot-spot chip is mounted in the first hole, and then the first hole is filled with a photopolymerizable resin.

Preferably, the pulse current is provided by a multiplex pulse power supply system.

The above aspects and advantages of the present invention will become more readily apparent to those ordinarily skilled in the art after reviewing the following detailed description and accompanying drawings, in which:

DETAILED DESCRIPTION OF THE PREFERRED EMBODIMENT

The invention is described more specifically with reference to the following embodiments. It is to be noted that the following descriptions of preferred embodiments of this invention are presented herein for the purpose of illustration and description only; it is not intended to be exhaustive or to be limited to the precise form disclosed.

Figure 1:
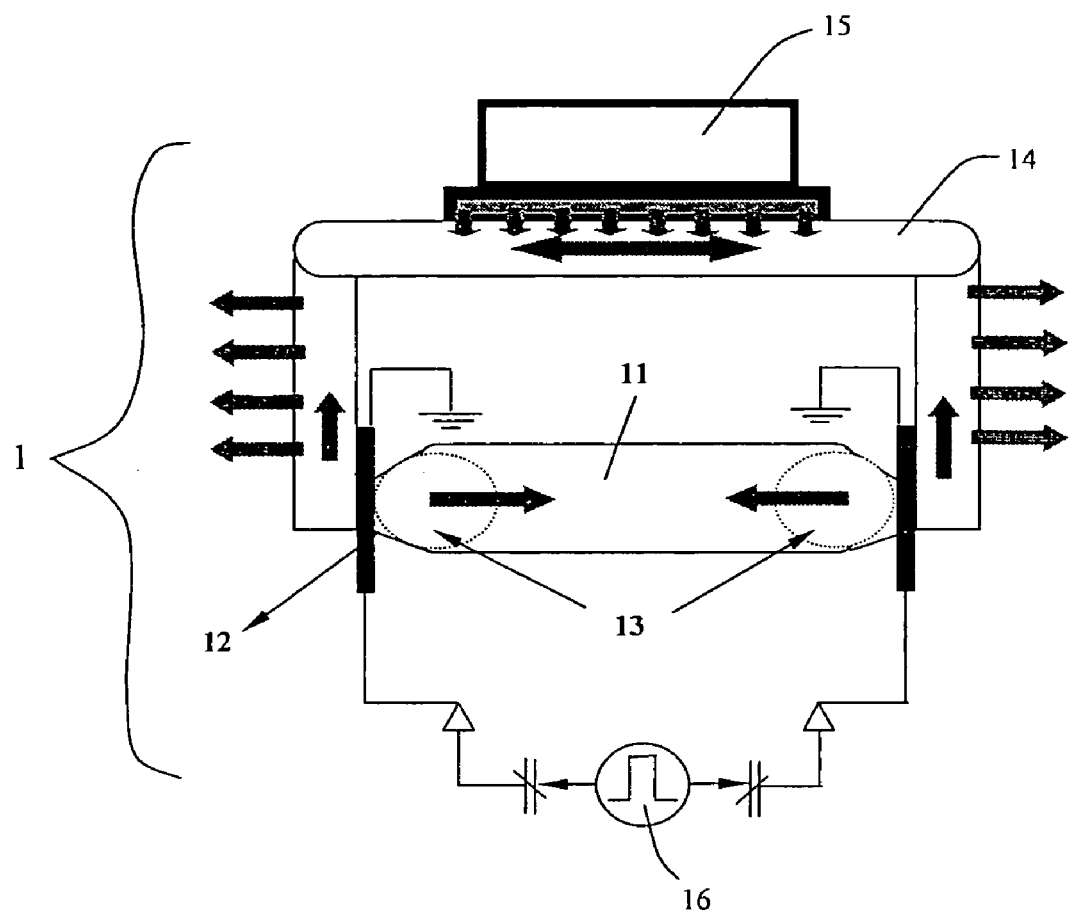
FIG. 1 is a schematic view showing a cooling device according to the preferred embodiment of the present invention.

Please refer to FIG. 1 showing a cooling device 1 according to the preferred embodiment of the present invention. The first channel 11 having narrowed ends is formed by micro etching. Two micro wires 12 are respectively immersed at the two narrowed ends of the first channel 11. The alternate pulse currents are provided to the micro wires 12 by a multiplex pulse power supply system 16, so that the temperature of the micro wires 12 can reach the nucleation temperature in a very short time and then micro bubbles 13 are produced around the wires. The cooling fluid in the second channel 14 is reciprocatingly pushed by the micro bubbles 13. The reciprocating cooling fluid is driven by the expansion and the contraction of the micro bubbles 13 to flow through the micro hot spot 15, and therefore the heat of the micro hot spot 15 is dissipated by convection of the reciprocating flow and the temperature of the micro hot spot 15 is lowered. It is advantageous that if the temperature of the micro hot spot 15 is lower, the heat of the micro hot spot 15 can be completely dissipated by the reciprocating flow, and furthermore if the temperature of the micro hot spot 15 is much higher, the heat of the micro hot spot 15 can be evenly diffused and the micro hot spot 15 would not be destroyed owing to the overheated micro spot. The cooling device provided by the present invention can be easily microfabricated and integrated into electronic components.

Figure 2:
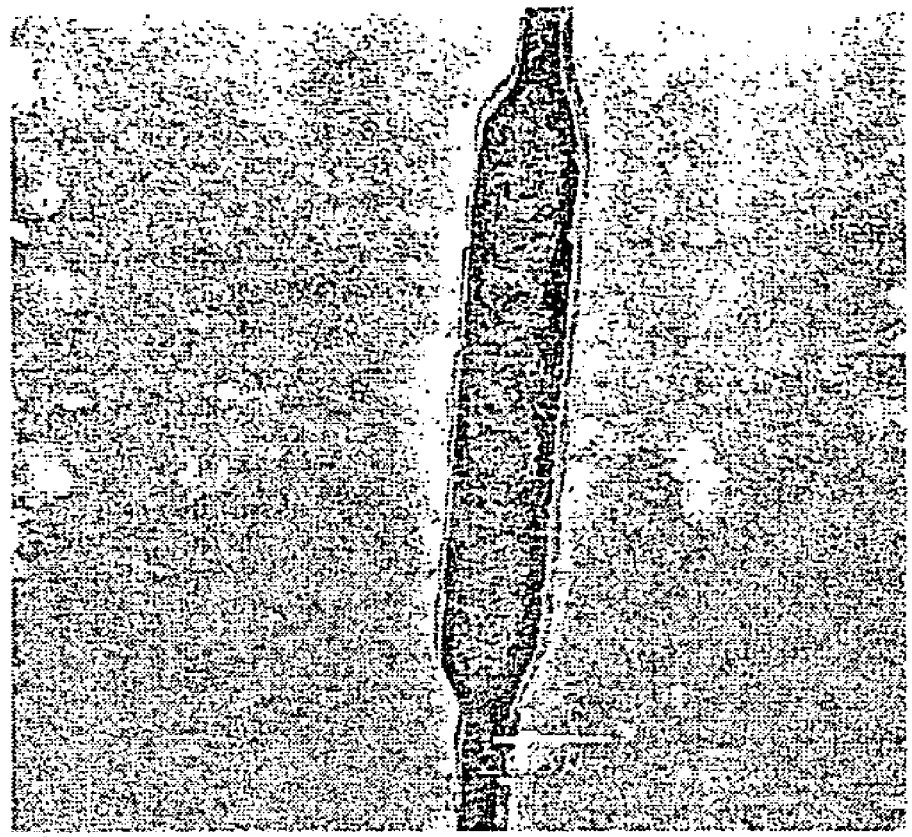
FIG. 2 is a scanning electron microscope (SEM) photograph of the first channel according to the preferred embodiment of the present invention.

Please refer to FIG. 2, which is a scanning electron microscope photograph showing the first channel 11 according to the preferred embodiment of the present invention. According to the preferred embodiment of the present invention, two micro wires 12 are respectively immersed in the two narrowed ends of the first channel 11. The alternate pulse currents are provided to the micro wires 12 by a multiplex pulse power supply system 16, so that the temperature of the micro wires 12 can reach the nucleation temperature in a very short time and then micro bubbles 13 are produced around the wires 12. When the micro bubble 13 are produced, the movement of the micro bubbles 13 is unidirectional due to that the movement of the micro bubbles 13 is limited by the narrowed ends of the first channel 11. Subsequently, the cooling fluid in the second channel 14 is reciprocatingly pushed by the micro bubbles 13. The reciprocating cooling fluid is driven by the expansion and the contraction of the micro bubbles 13 to flow through the micro hot spot 15, and therefore the heat of the micro hot spot 15 is dissipated by convection of the reciprocating cooling fluid and the temperature of the micro hot spot 15 is lowered.

It is never shown in the conventional technologies that the reciprocating cooling fluid in the second channel 14 is driven by the micro bubble 13 produced around the micro wires 12. The flow speed and the reciprocation frequency of the reciprocating flow are dependent on the formation mechanism of the micro bubbles 13.

With regard to the formation of the micro bubbles 13, the wires 12 can be fine platinum wires to be provided as heaters, and the chosen diameter of the wires 12 is dependent on the width of the first channel 11, so that the current and pulse on the wires 12 are tightly controlled to produce micro bubbles 13 around the wires 12.

Figure 3A:
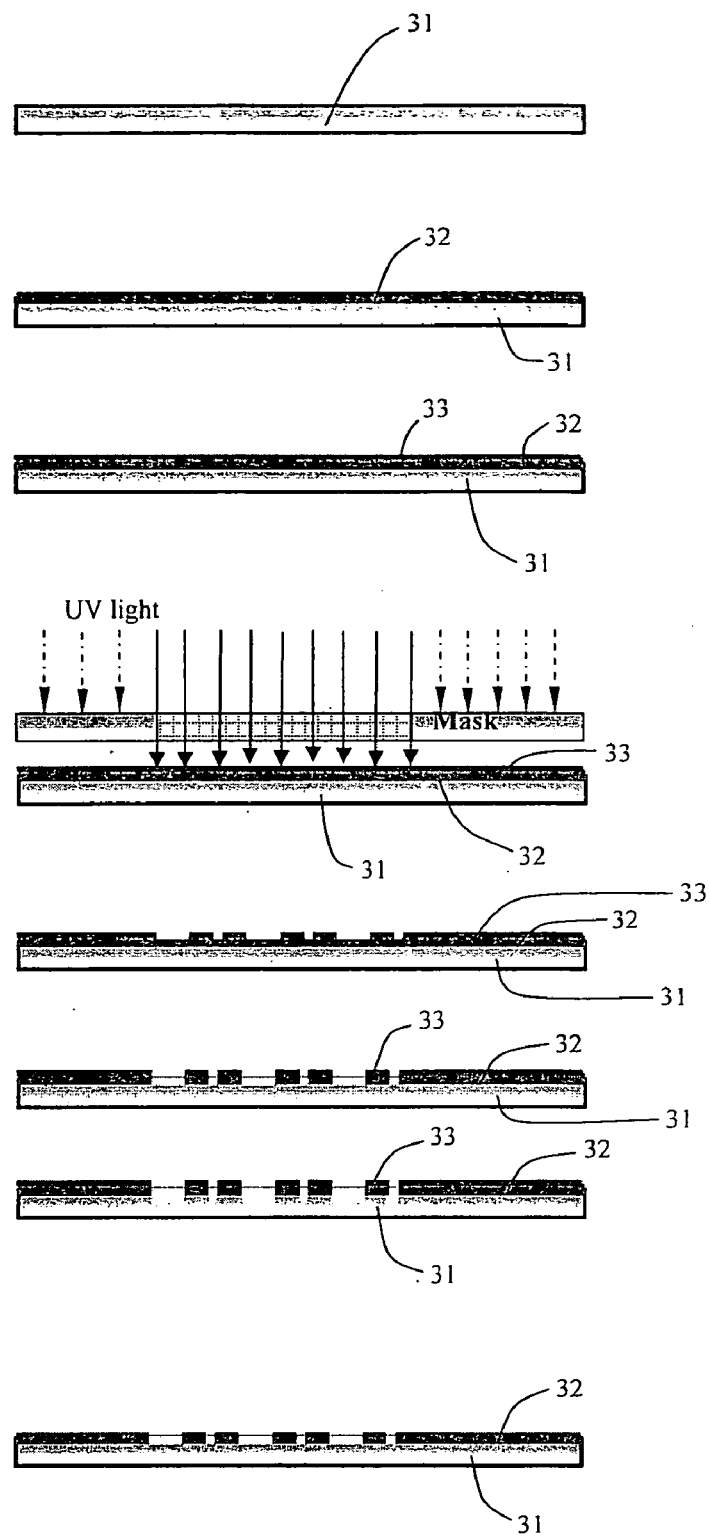
FIG. 3(a) is a flow chart showing the steps for fabricating the first channel according to the preferred embodiment of the present invention.

With regard to the formation of the first channel 11, Indium Tin Oxide (ITO) glass can be used as the substrate of the first channel 11, so that the actuating status can be clearly observed when the cooling device is actuated. A part of the first channel 11 is formed through an isotropical etching by a low concentration of the hydrofluoric solution, wherein the temperature and period of the etching is controlled in order to form a smooth channel. The fabrication of the first channel 11 is illustrated in FIG. 3(a). The steps for fabricating the first channel 11 include (a) providing a first substrate 31, (b) forming an ITO resist layer 32 on the first substrate 31, (c) forming a photoresist layer 33 on the ITO resist layer 32, (d) exposing the photoresist layer 33 to ultraviolet, (e) developing the photoresist layer 33, (f) etching the ITO resist layer 32, (g) etching the first substrate 31, and (h) removing the photoresist layer 33.

After the fabrication of the first channel 11, the wires 12 are arranged in the narrowed ends of the first channel 11 by a ultrasonic micro pressing device and extended out of the ends of the first channel 11. The first channel 11 further includes a high molecular metal substrate or a metal substrate with a high impedance as a second substrate 34 (shown in FIG. 3(b)) to package the first channel 11.

Figure 3B:
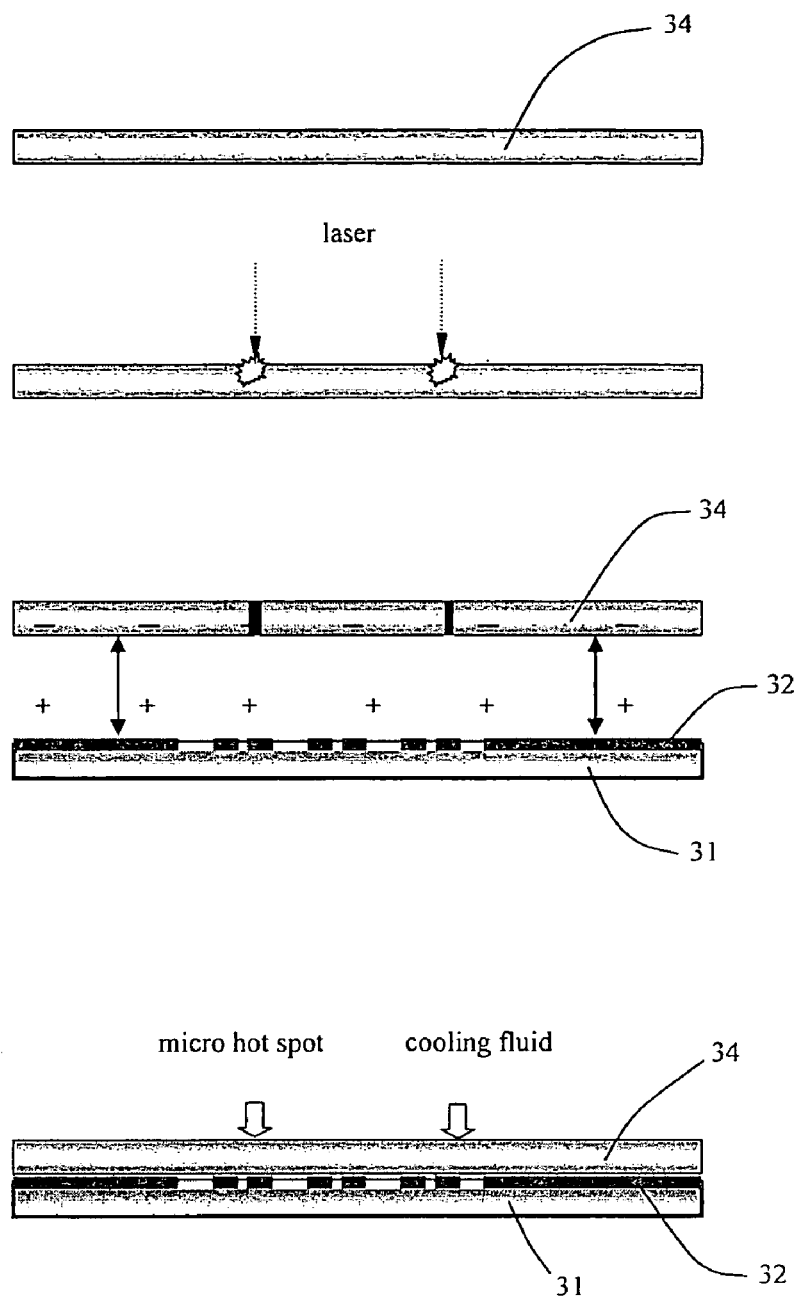
FIG. 3(b) is a flow chart showing package of the cooling device according to the preferred embodiment of the present invention.
Figure 4:
FIG. 4 is a scanning electron microscope (SEM) photograph of the cooling device according to the preferred embodiment of the present invention.

After the first channel 11 is packaged, the second substrate 34 is microetched to form a first hole and a second hole, wherein the first hole is bigger than the second hole. The deionized water is injected into the first channel 11 via the second hole, and then the second hole is filled with a photopolymerizable resin. A micro-hot-spot chip 15 is mounted into the second channel 14 via the first hole, and then the first hole is filled with a photopolymerizable resin. The package of the cooling device provided by the present invention is illustrated in FIG. 3(b). The steps for packaging the cooling device include (a) cleaning the second substrate 34, (b) forming holes on the second substrate 34 by a laser, (c) disposing the micro wires 12 at the narrowed ends of the first channel 11 and then connecting the micro wires 12 with the second substrate 34 by the plasma activation, (d) injecting the cooling fluid and mounting the micro-hot-spot chip 15 and then filling the holes with a photopolymerizable resin, which is then activated by UV light.

In order to further illustrate the efficacy of the cooling device provided by the present invention, the results of experiments are described in the followings.

The hot micro bubbles 13 produced around the micro wires 12 are used for driving the cooling fluid to reciprocatingly flow but not for heating the cooling fluid since the thermal energy transferred from the hot micro bubble 13 to the cooling fluid is about the thousandth thermal energy of the micro hot spot. It has been experimented that the thermal energy transferred from the bubble to the cooling fluid is about $10^{-7}$–$10^{-9}$ W; however, the thermal energy of the micro hot spot is about $2.5 \times 10^{-3}$–$10^{-4}$ W, so that the thermal energy transferred from the bubble 13 to the cooling fluid can be neglected.

The relationship between the thermal energies of second channel 14 and the micro hot spot 15 is analyzed by an equation regarding the thermal conduction, wherein the cooling fluid is incompressible and has the convection coefficient of $h_c$, the cooling fluid is a fully developed uniform laminar flow, so that the viscous dissipation and the pressure can be neglected. Therefore the equation is obtained as follows, $$\frac{\partial T}{\partial t} + u\frac{\partial T}{\partial x} = \alpha_f \left[\frac{\partial^2 T}{\partial x^2} + \frac{\partial^2 T}{\partial y^2}\right]$$

wherein T is the temperature, t is the time period, x is the speed of the reciprocating flow, u is equal to $u(y)\cos \omega t$, $\alpha_f$ is the diffusion coefficient of the fluid flow. The dimensionless factors are illustrated as follows, $\tau = \omega t$, $Y = y/H$, $X = x/H$, $U(Y) = u(y)/u_m$, $\theta = (T-T_a)/(qH/k_f)$ $\alpha = H(\omega 2/\nu)^{1/2}$, $Re = u_m H/\nu$, $Pr = \nu/\alpha_f$, $Pe = RePr$ wherein H is the height of the second channel, $u_m$ is the initial average velocity, $T_a$ is the temperature around the cooling fluid, q is the thermal energy of the micro hot spot, and $K_f$ is the conduction coefficient of the cooling fluid. Therefore the equation is converted as follows.

$$\alpha^2 \frac{\partial \theta}{\partial \tau} + PeU(Y)\cos(\tau)\frac{\partial \theta}{\partial X} = \frac{\partial^2 \theta}{\partial X^2} + \frac{\partial^2 \theta}{\partial Y^2}$$

According to the results of the experiments, $\alpha$ and Pe is calculated as follows.

$Re = 0.56$~$55$, $Pr = 7.07$, $Pe = 3.96$~$388.8$ and $\alpha = 0.0167$~$0.167$.

The time period of the thermal diffusion is 0.017 sec ($H^2/\alpha_f = 0.017$), and the time period for the fluid to absorb the thermal energy of the micro hot spot is much shorter than the fastest frequency, 10 Hz, of the reciprocating flow. The time coefficient, $\alpha^2$, is much smaller than Pe, so that the variation of the time period can be neglected. In addition, the limitations can be set as follows.

$$-k_f \frac{\partial T}{\partial y} = -h_c(T - T_a) \quad y = 0, 0 \le x < L_u$$

$$-k_f \frac{\partial T}{\partial y} = q \quad y = 0, L_u \le x \le L_u + B$$

$$-k_f \frac{\partial T}{\partial y} = -h_c(T - T_a) \quad y = 0, L_u + B \le x \le L_u + B + L_d$$

$$-k_f \frac{\partial T}{\partial y} = -h_c(T - T_a) \quad y = H, 0 \le x \le L_u + B + L_d$$

Furthermore, the limitations of the dimensionless equations can be set as follows.

$$\frac{\partial \theta}{\partial Y} = Nu_c \theta \quad Y = 0, 0 \le X < L_u/H$$

$$\frac{\partial \theta}{\partial Y} = -1 \quad Y = 0, L_u/H \le X \le (L_u + B)/H$$

$$\frac{\partial \theta}{\partial Y} = Nu_c \theta \quad Y = 0, (L_u + B)/H \le X \le (L_u + B + L_d)/H$$

$$\frac{\partial \theta}{\partial Y} = -Nu_c \theta \quad Y = 1, 0 \le X \le (L_u + B + L_d)/H$$

Figure 5:
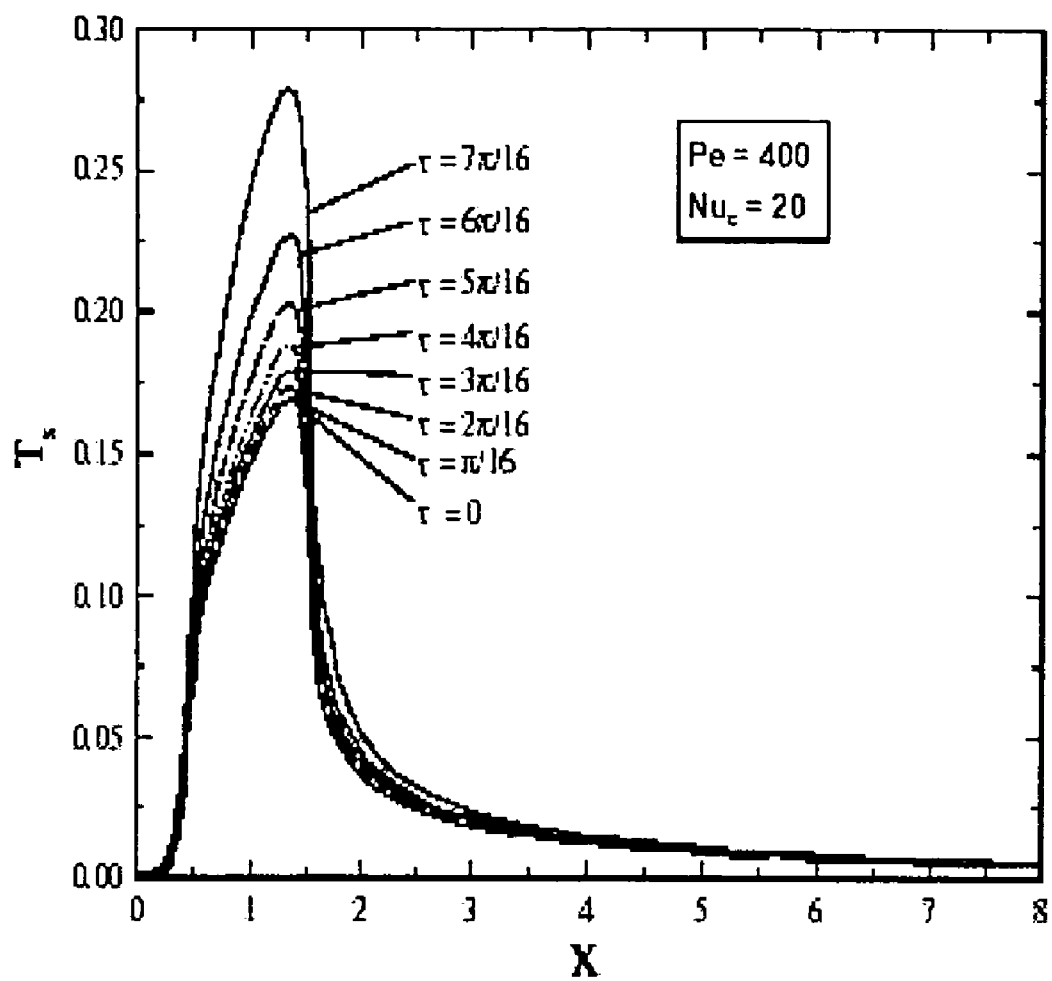
FIG. 5 is a chart showing the relationship between the dimensionless length X and the average temperature $T_s$ of the micro hot spot according to the preferred embodiment of the present invention.

According to the foresaid theoretical analysis and the data from experiments, when Pe is equal to 400 and $Nu_c$ is equal to 20, the relationship between the dimensionless length X and the average temperature Ts of the micro hot spot in the time period from 0 to $7\pi/16$ is shown in FIG. 5. When the heat dissipation works at the wall of the second channel 14 and $Nu_c$ is equal to 20, X is in the range of 0.6 and 1.6. Referring to FIG. 5, the temperature distribution of the flow path is not shown as point symmetry; however, the flowing of the cooling fluid is dragging since the reciprocating flow passing through the micro hot spot 15 is heated and then flows downstream. It means that the amount of the heat produced from the micro hot spot 15 is kept in a stable status, wherein the heat is continuously dissipated toward downstream of the second channel 14 due to the convection formed by the reciprocating cooling fluid.

Figure 6:
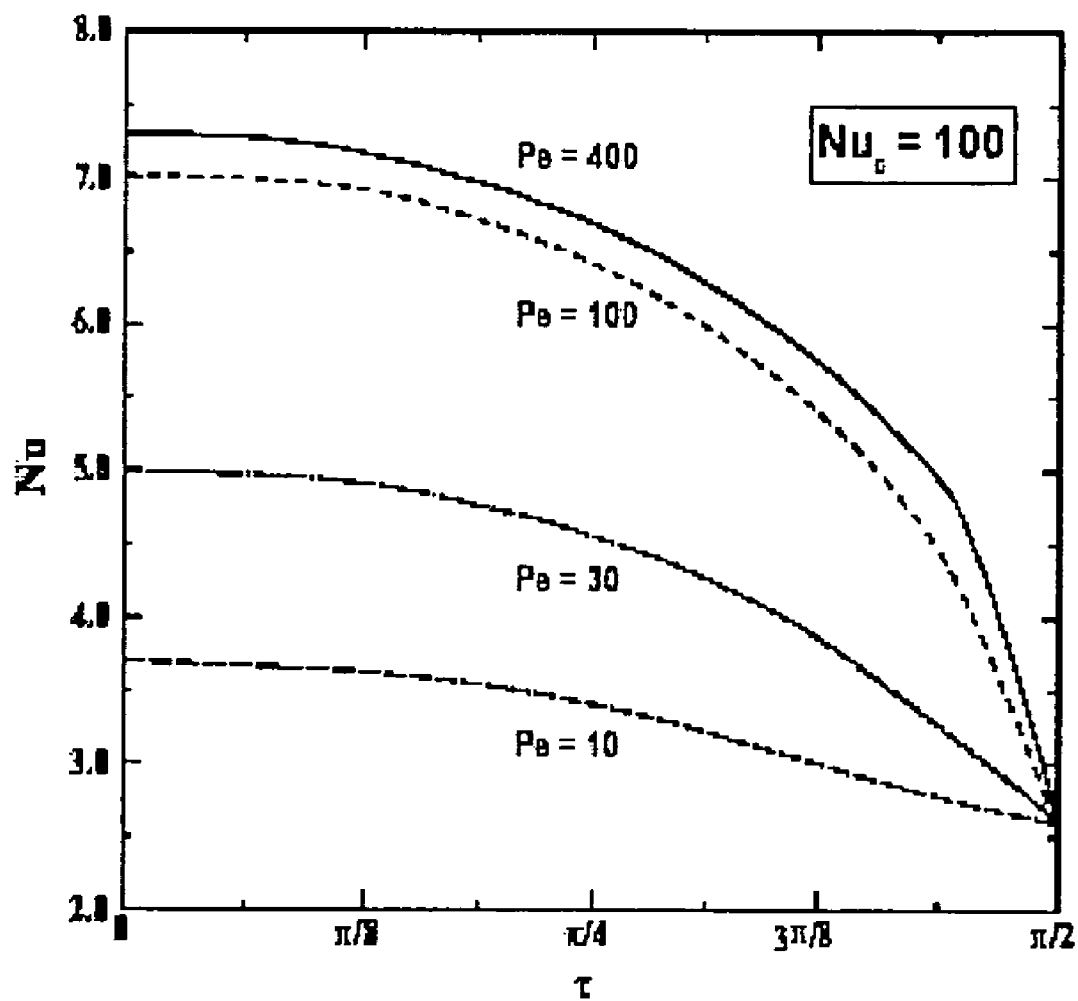
FIG. 6 is a chart showing the relationship between Nu and $\tau$ when Nu is equal to 100 according to the preferred embodiment of the present invention.

Please refer to FIG. 6 showing the relationship between Nu and τ at Pe=400, 100, 30 and 10 when Nuc is equal to 100. When the time period is getting increased, the Nusselt number Nu is getting decreased, and this phenomenon is more dramatic when Pe is higher. It means that when the reciprocation frequency of the reciprocating flow is higher, the effect of the heat dissipation is greater.

Figure 7:
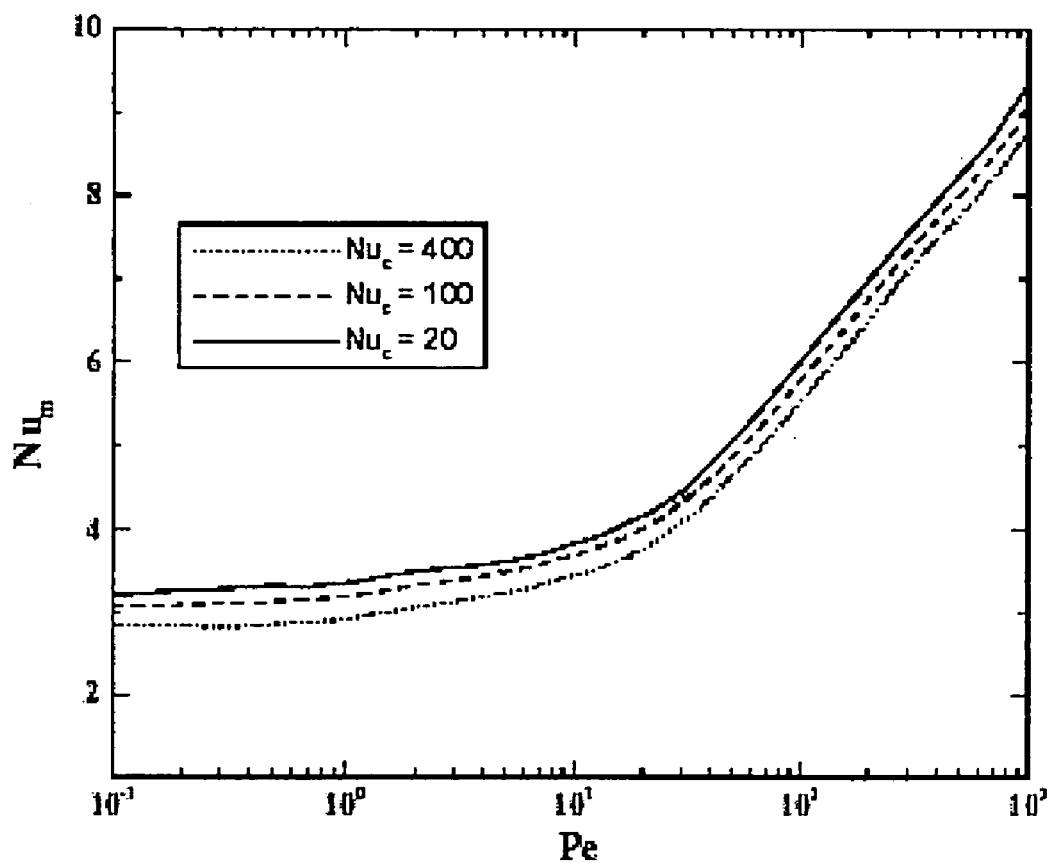
FIG. 7 is a chart showing the relationship between the average of Nusselt number and the Peclet number according to the preferred embodiment of the present invention.

Please refer to FIG. 7 showing the relationship between Nesselt number $Nu_m$ and Peclet number Pe at Pe=20, 100 and 400. If Pe is in the range of 0.1 and 10, there is no significant change for $Nu_m$ value; if Pe is larger than 40, Nusselt number $Nu_m$ is linearly increased. Accordingly, only when Pe is larger than 40, the micro hot spot 15 is simply cooled by the reciprocating cooling fluid. In addition, if Pe is smaller than 10, Nusselt number $Nu_m$ has to be increased in order to achieve the heat dissipation; however, only the size of the second channel 14 is increased, the Nusselt number $Nu_m$ is increased. If Pe is larger than 100, the heat dissipation of the micro hot spot 15 relies on the reciprocating cooling fluid but not on the increase size of the second channel 14. Hence, if Pe is smaller than 10, the heat dissipation of the micro hot spot 15 depends on the size of the second channel 14; and if Pe is larger than 100, the heat dissipation of the micro hot spot 15 depends on the reciprocating cooling fluid.

In conclusion, the present invention provide a device and a method for cooling a micro hot spot. The cooling device provided by the present invention includes a first channel 11 having narrowed ends. Micro bubbles 13 are alternately formed in the narrowed ends of the first channel 11, and the cooling fluid is driven by the expansion and contraction of the micro bubbles 13 to reciprocatingly flow, so that the heat of the micro hot spot 15 is dissipated by the convection caused by the reciprocating cooling fluid and the temperature of the micro hot spot 15 is lowered. It is much more advantageous than the traditional cooling device that the cooling device provided by the present invention can be easily microfabricated and easily integrated in electronic components.

According to the results of experiments, the heat of the micro hot spot can be efficiently dissipated by the cooling device of the present invention, especially in a micro system with low Reynolds number. The amount of the heat produced from the micro hot spot 15 is kept in a stable status, wherein the heat is continuously dissipated toward downstream of the second channel 14 due to the convection caused by the reciprocating cooling fluid. When the reciprocation frequency of the reciprocating fluid flow is higher, the effect of the heat dissipation is greater. With regard to the efficacy of the heat dissipation, if Pe is smaller than 10, the heat dissipation of the micro hot spot 15 depends on the size of the second channel 14; and if Pe is larger than 100, the heat dissipation of the micro hot spot 15 depends on the reciprocating cooling fluid.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A cooling device for cooling a micro hot spot, comprising:
   a first substrate;
   a first channel formed on said first substrate and having two narrowed ends;
   a second channel formed on said first substrate and connected to said first channel;
   a cooling fluid injected into said first channel and said second channel;
   a second substrate connected to said first substrate and having said micro hot spot disposed thereon;
   two wires disposed at said narrowed ends of said first channel; and
   a power supply for providing a pulse current to said wires, thereby micro bubbles being produced around said wires.

2. The cooling device according to claim 1, wherein said micro hot spot is a micro-hot-spot chip.

3. The cooling device according to claim 1, wherein said first substrate is a glass substrate having a metal film with a high impedance coated thereon.

4. The cooling device according to claim 1 wherein said second substrate is one of a high molecular metal substrate and a metal substrate with a high impedance.

5. The cooling device according to claim 1, wherein said second substrate is connected to said first substrate by means of a plasma activation.

6. The cooling device according to claim 1, wherein said wires are fine platinum wires.

7. The cooling device according to claim 1, wherein said wires are disposed at said narrowed ends of said first channel by an ultrasonic micro pressing device.

8. The cooling device according to claim 1, wherein said power supply is a multiplex pulse power supply system.

* * * * *